(12) United States Patent
Fry

(10) Patent No.: US 8,166,428 B2
(45) Date of Patent: Apr. 24, 2012

(54) SYNTHESIZED LOGIC REPLACEMENT

(75) Inventor: Randall P. Fry, Greenville, NC (US)

(73) Assignee: LSI Corporation, Milpitas, CA (US)

( * ) Notice: Subject to any disclaimer, the term of this patent is extended or adjusted under 35 U.S.C. 154(b) by 841 days.

(21) Appl. No.: 12/193,566

(22) Filed: Aug. 18, 2008

(65) Prior Publication Data

US 2010/0042966 A1 Feb. 18, 2010

(51) Int. Cl.
*G06F 17/50* (2006.01)
(52) U.S. Cl. ........................... 716/104; 716/103
(58) Field of Classification Search .................. 716/103, 716/104
See application file for complete search history.

(56) References Cited

U.S. PATENT DOCUMENTS 5,572,535 A * 11/1996 Pixley et al. .................. 714/724
6,317,860 B1 * 11/2001 Heile ............................. 716/102
6,324,679 B1 * 11/2001 Raghunathan et al. ....... 716/133

* cited by examiner

*Primary Examiner* — Vuthe Siek
(74) *Attorney, Agent, or Firm* — Alexander J. Neudeck; Cochran Freund & Young, LLC

(57) ABSTRACT

Disclosed is a method of improving a synthesized circuit design comprising searching the synthesized circuit design for a first instance of a first pattern of gates. The first instance is removed from the synthesized circuit design. The first instance is replaced with a non-synthesized cell. A method of altering a multiplexer implementation comprises receiving a netlist that describes a synthesized logic circuit design. Parsing the netlist to detect a first instance of a first pattern of gates that implements a first multiplexer. The first instance is replaced in the netlist with a technology implementation of the first multiplexer.

20 Claims, 5 Drawing Sheets

SYNTHESIZED LOGIC REPLACEMENT

BACKGROUND OF THE INVENTION

Electronic design automation (EDA) is a category of tools that facilitate the design of complex electronic systems such as integrated circuits. Over the years, EDA tools have become increasingly complex. EDA tools have evolved from simple circuit simulators such as SPICE to include most aspects of logic design, layout, and verification. One aspect of integrated circuit design that is now encompassed by EDA tools is the synthesis of large portions (or entire) application specific integrated circuits (ASICs) from higher level behavioral models such as Verilog and VHDL. This synthesis process generates design implementations in terms of logic gates from higher level behavioral models.

SUMMARY OF THE INVENTION

An embodiment of the invention may therefore comprise a method of improving a synthesized circuit design comprising searching said synthesized circuit design for a first instance of a first pattern of gates; removing said first instance from said synthesized circuit design; and, replacing said first instance with a non-synthesized cell.

An embodiment of the invention may therefore further comprise a method of altering a multiplexer implementation comprising receiving a netlist that describes a synthesized logic circuit design; parsing said netlist to detect a first instance of a first pattern of gates that implements a first multiplexer; and, replacing, in said netlist, said first instance with a technology implementation of said first multiplexer.

DETAILED DESCRIPTION OF THE EMBODIMENTS

Figure 1:
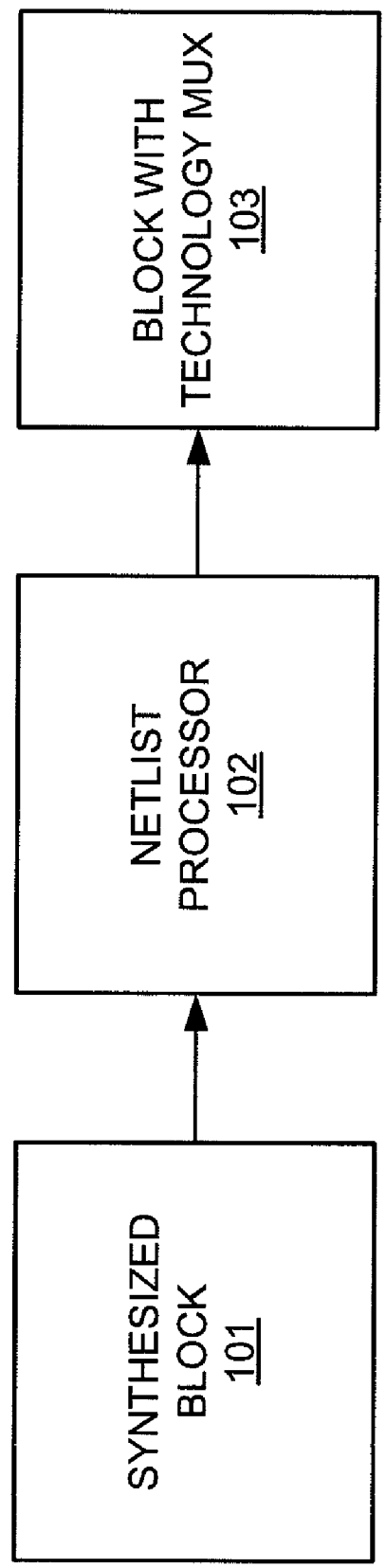
FIG. 1 is a block diagram of a system that alters a multiplexer implementation.

FIG. 1 is a block diagram of a system that alters a multiplexer implementation. A hardware description language (HDL) description of a synthesized block 101 is input to a netlist processor 102. The netlist processor produces a block 103 with a technology MUX. The block 103 with a technology MUX is also described by an HDL description. However, in at least one instance, the netlist processor has substituted a technology MUX for a first pattern of gates.

An HDL description may be referred to as a netlist. An example of an HDL description language is Verilog Hardware description language. Netlist processor 102 may be implemented on a computer. Instructions for implementing netlist processor 102 may be stored on a computer readable medium.

Synthesized block 101 may be a pre-layout or post-layout block. In other words, the netlist that describes synthesized block 101 may be generated from a design schematic representation of synthesized block 101 (i.e., pre-layout). Or, the netlist that describes synthesized block 101 may be generated from a physical design wherein many of the gates and traces of synthesized block 101 have been placed and routed (i.e., post-layout). If the netlist that describes synthesized block 101 is a post-layout netlist, then netlist processor 102 may consider parameters such as timing, congestion, and power dissipation when determining whether to substituted a technology MUX for a given instance of a pattern of gates.

A technology MUX is a logic cell that implements a multiplexer function. However, instead of being synthesized from less complex logic gates (such as AND, OR, AND-OR, etc.), a technology MUX is a library cell implementation of a multiplexer function. In other words, a technology MUX is a library implementation of a multiplexer function that is native to the library and is not constructed from other non-multiplexer library cells.

In an embodiment, netlist processor 102 may search synthesized block 101 for a first instance of a first pattern of gates. This first pattern of gates would be a pattern that implements a multiplexer function. This first pattern of gates may implement different types of multiplexer functions such as generic, one-hot, or priority MUX's.

For example, netlist processor 102 may search for a pattern of gates that includes a 2:2 AND-OR gate with a signal connected to an input of a first AND function and its complement (as generated by an inverter) connected to an input of the other AND function. (Note: a 2:2 AND-OR gate denotes an AND-OR function with two AND gates each with two inputs.) This pattern of gates implements a 2:1 multiplexer function. Thus, netlist processor may remove an instance of this pattern of gates from synthesized block 101 and replace it with a non-synthesized implementation of a 2:1 multiplexer function in block 103. Other patterns of gates that implement larger multiplexer functions (e.g., 6:1, 8:1, etc.) may also be searched for and replaced by netlist processor 102. These other patterns may include searching for patterns of cascaded multiplexer functions. For example, the output of a multiplexer function may be input to a 2:2 AND-OR gate as part of a larger fan-in multiplexer function.

By replacing one or more instances of a pattern of gates, congestion or timing issues that may be present in synthesized block 101 may be reduced or eliminated in block 103. This is because suboptimal implementations are sometimes selected when synthesized block 101 is produced. These suboptimal implementations may result is more logic cell instances than is necessary. These suboptimal implementations may also result in the control signals for a multiplexer function being overburdened.

A synthesis tool may select these suboptimal implementations because the information supplied to the synthesis tool makes them appear to the synthesis tools as smaller and faster. However, due to cell pin densities and other factors, using a high density of these implementations (and in particular, those using AND-OR gates) in a small area may lead to more congestion and timing issues than using technology MUX cells.

Figure 2:
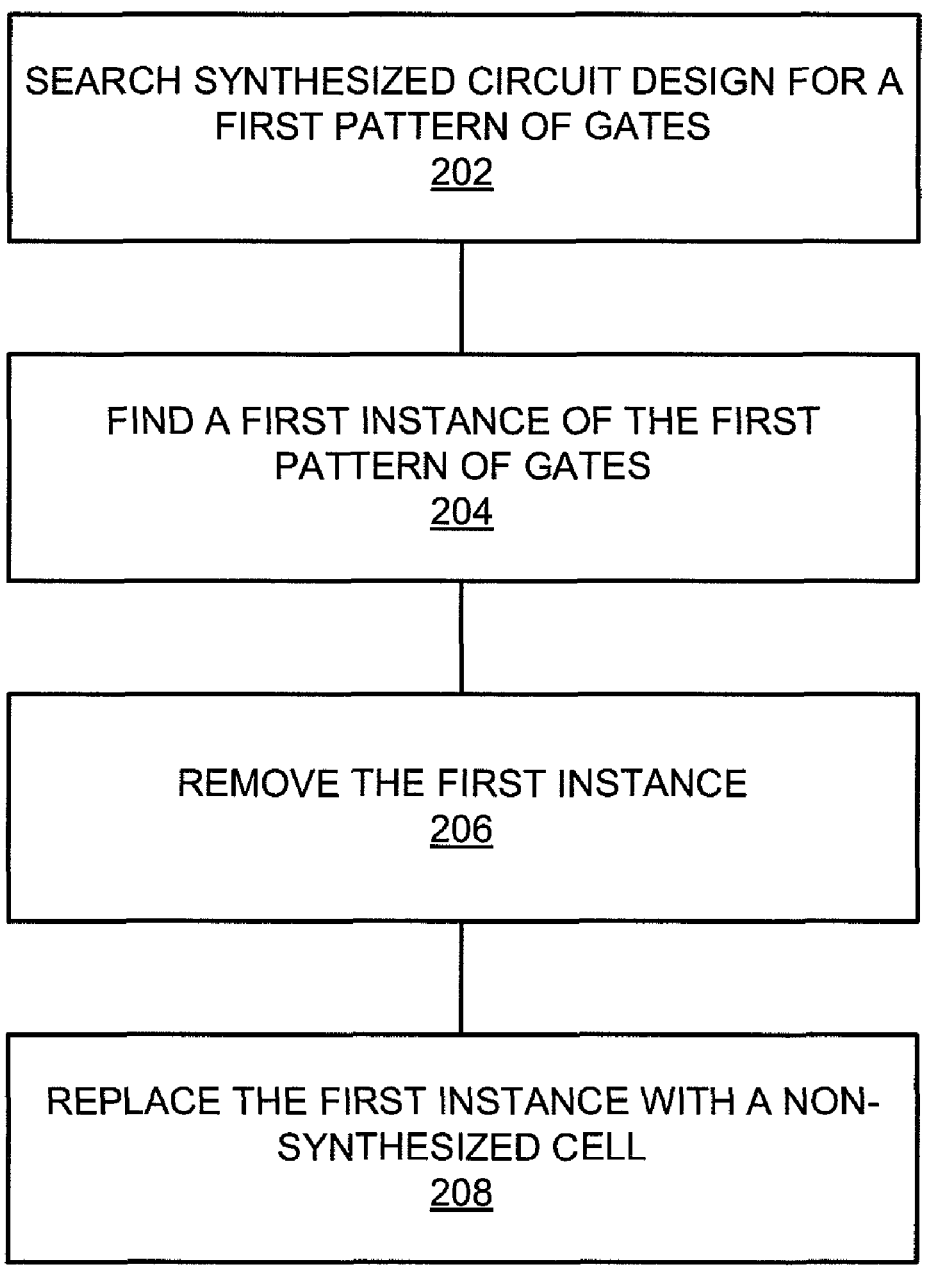
FIG. 2 is a flowchart of a method of improving a synthesized design.

FIG. 2 is a flowchart of a method of improving a synthesized design. The steps illustrated in FIG. 2 may be performed by netlist processor 102. A synthesized circuit design is searched for a first pattern of gates (202). For example, netlist processor 102 may search synthesized block 101 for a first pattern of gates. The first pattern of gates may implement a multiplexer function. This first pattern of gates may implement different types of multiplexer functions such as generic, one-hot, or priority MUX's. For example, a netlist processor 102 may search for a first pattern of gates that comprises a 2:2 AND-OR gate with a first signal connected to a first AND function logic input and a complement of the first signal as generated by an inverter connected to second AND function logic input. This first pattern of gates implements a 2:1 MUX.

In another example, to search for the first pattern of gates, netlist processor 102 may evaluate the Boolean algebra implemented by a group of gates to determine if they implement a multiplexer function. In another example, to search for the first pattern of gates, netlist processor 102 may apply a test pattern of inputs and evaluate the output to determine if a group of gates implements a multiplexer function. In another example, to search for the first pattern of gates, netlist processor 102 may determine a truth table for a group of gates. The truth table may then be examined to determine if the group of gates implements a multiplexer function. In an embodiment, the first pattern of gates implementing a multiplexer function may range from a small (e.g., 2:1) to a relatively large (e.g., 16:1) number of inputs.

A first instance of the first pattern of gates is found (204). For example, netlist processor 102 may find a first instance of a pattern of gates that implements a 2:1 MUX. The first instance is removed (206). For example, netlist processor 102 may remove a first instance of a pattern of gates that implements a 2:1 MUX from synthesized block 101. The first instance is replaced with a non-synthesized cell (208). For example, netlist processor 102 may replace a first instance of a pattern of gates that implements a 2:1 MUX from synthesized block 101 before block 103 is output.

Figure 3:
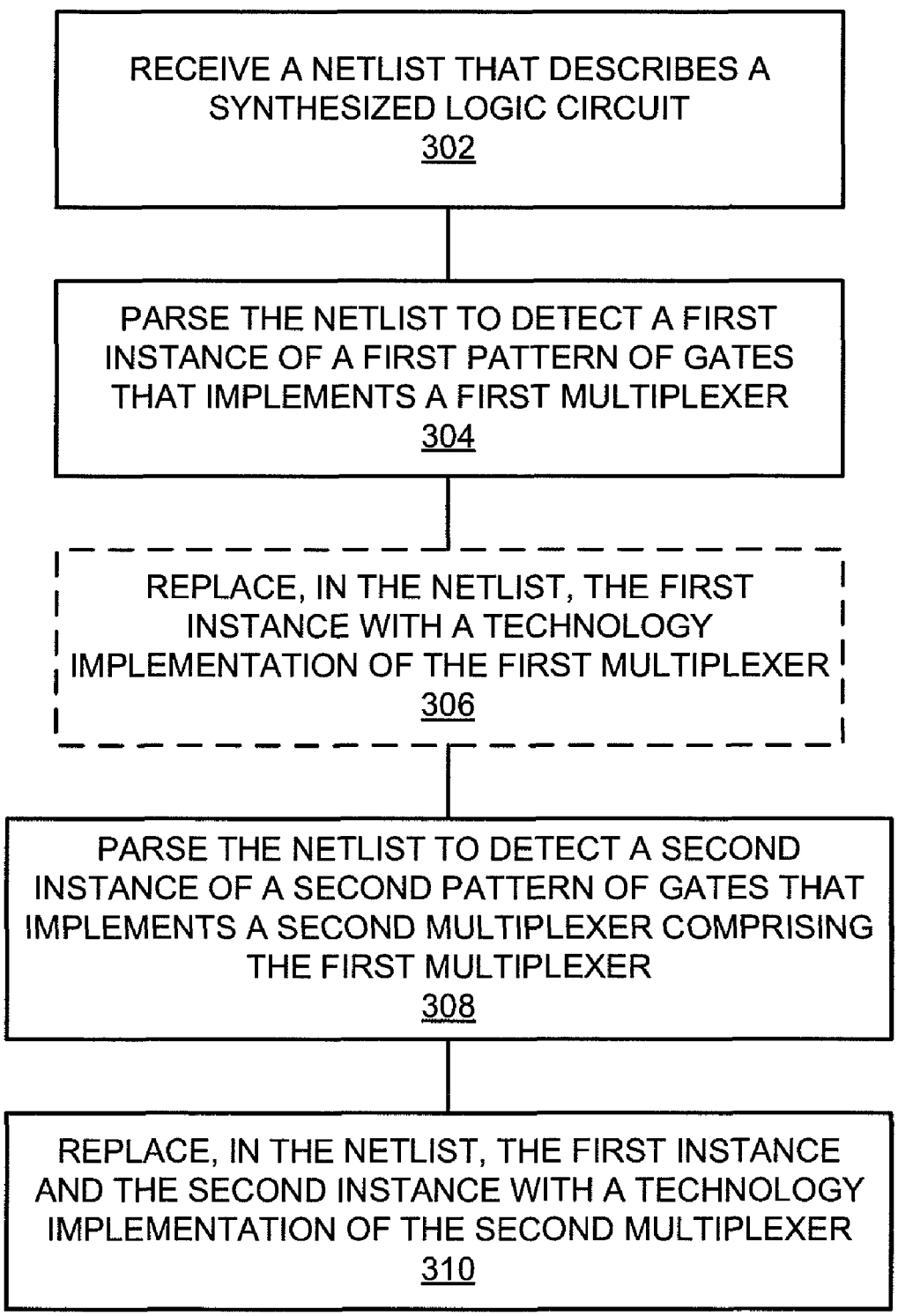
FIG. 3 is a flowchart of a method of altering a multiplexer implementation.

FIG. 3 is a flowchart of a method of altering a multiplexer implementation. The steps illustrated in FIG. 3 may be performed by netlist processor 102. A netlist is received that describes a synthesized logic circuit (302). For example, netlist processor 102 may receive an HDL description of synthesized block 101. The netlist is parsed to detect a first instance of a first pattern of gates that implements a first multiplexer (304). This first pattern of gates may implement different types of multiplexer functions such as generic, one-hot, or priority MUX's. For example, netlist processor 102 may parse an HDL description of synthesized block 101 to detect whether a particular group of gates in synthesized block 101 implements a multiplexer function.

Optionally, the first instance is replaced in the netlist with a technology implementation of the first multiplexer (306). Block 306 is shown in FIG. 3 with a dashed line to indicate this step is optional. The netlist is parsed to detect a second instance of a second pattern of gates that implements a multiplexer comprising the first multiplexer (308). For example, a large fan-in multiplexer (e.g., 6:1, 8:1, etc.) may be constructed from multiple 2:1 MUXs. Thus, the netlist would be parsed to detect a pattern of gates that implements a large fan-in multiplexer from low fan-in multiplexers that were detected in block 304. These large fan-in multiplexer functions may be comprised of cascaded multiplexer functions. These large fan-in multiplexer functions may comprise generic, one-hot, or priority multiplexer functions.

The first instance and the second instance are replaced in the netlist with a technology implementation of the second multiplexer (310). For example, netlist processor 102 may replace multiple instances of a 2:1 multiplexer function with a technology implementation of a large fan-in multiplexer.

Figure 4:
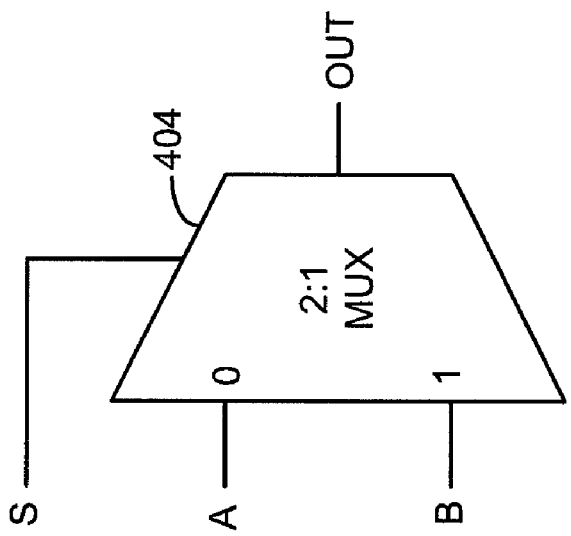
FIG. 4 is an illustration of a pattern of gates and a corresponding multiplexer implementation.
Figure 4:
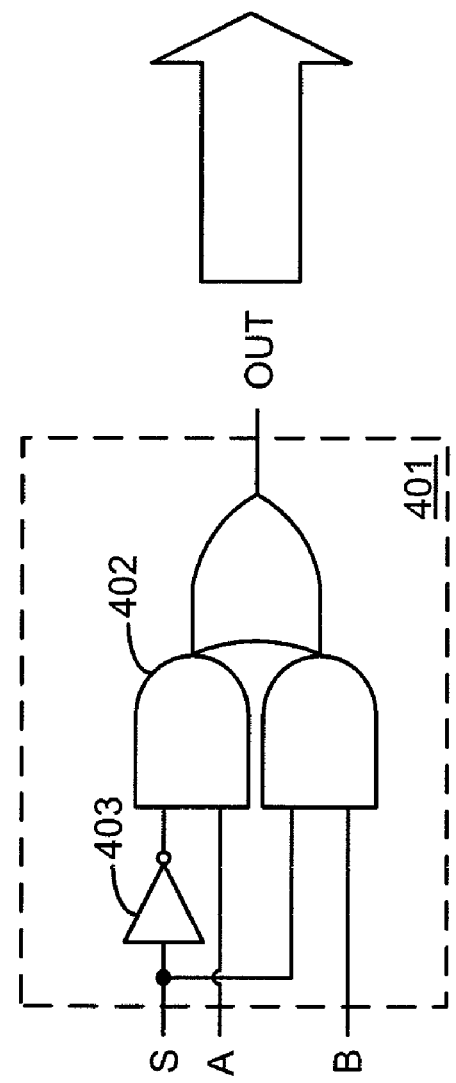

FIG. 4 is an illustration of a pattern of gates and a corresponding multiplexer implementation. In FIG. 4, pattern of gates 401 implements a 2:1 multiplexer function using a 2:2 AND-OR gate 402 and an inverter 403. The control input S is connected to the input of inverter 403 and an input of a first AND function of AND-OR gate 402. Data input A is connected to an input of a second AND function of AND-OR gate 402. Data input B is connect to the other input of the first AND function of AND-OR gate 402. The output of inverter 403 is connected to the other input of the second AND function of AND-OR gate 402. The output of the OR function of AND-OR gate 402 is the output of the pattern of gates 401 that implements a 2:1 multiplexer function. 2:1 MUX 404 is a technology cell implementation of the pattern of gates 401.

Figure 5:
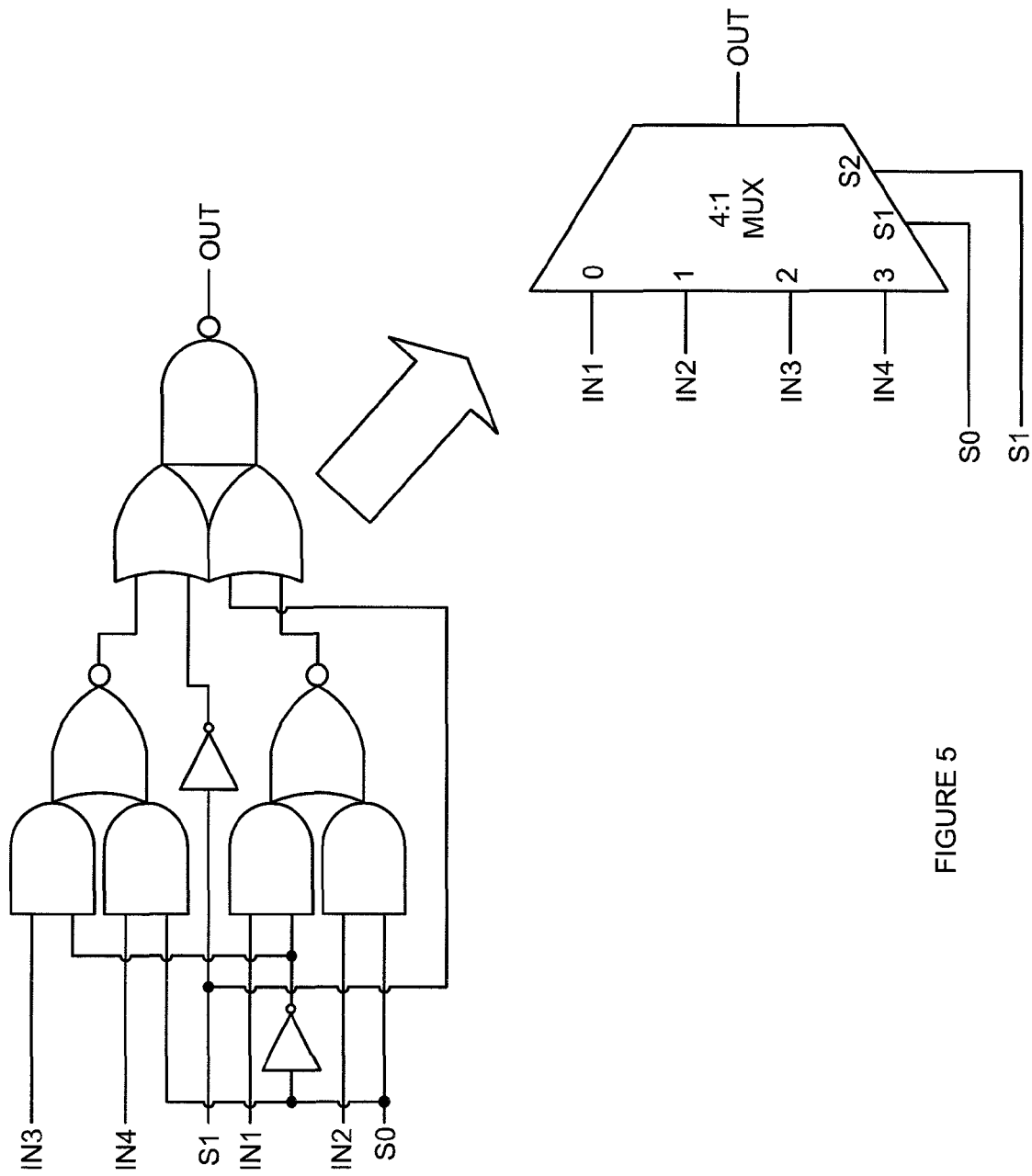
FIG. 5 is an illustration of a larger fan-in pattern of gates and a corresponding multiplexer implementation.

FIG. 5 is an illustration of a larger fan-in pattern of gates and a corresponding multiplexer implementation. As can be seen from FIG. 5, the logic cell instance count and the number of signal networks are improved by the system and methods disclosed herein.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of improving a synthesized circuit design, comprising:
    searching, by a computer, said synthesized circuit design for a first instance of a first synthesized pattern of gates;
    removing, by said computer, said first instance from said synthesized circuit design; and,
    replacing, by said computer, said first instance with a first non-synthesized cell.

2. The method of claim 1, wherein said first synthesized pattern of gates implements a multiplexer logic operation and said first non-synthesized cell implements a multiplexer function.

3. The method of claim 2, wherein said first synthesized pattern of gates comprises a 2:2 AND-OR gate with a first signal connected to a first AND function logic input and a complement of said first signal connected to second AND function logic input.

4. The method of claim 2, wherein said first synthesized pattern of gates comprises a plurality of 2:2 AND-OR gates comprised of at least a first 2:2 AND-OR gate having an output that is connected to an AND function logic input of a second 2:2 AND-OR gate.

5. The method of claim 1, further comprising:
    mapping, by said computer, said first synthesized pattern of gates to said first non-synthesized cell.

6. The method of claim 1, further comprising:
    searching, by said computer, said synthesized circuit design for a second instance of a second synthesized pattern of gates that includes said first synthesized pattern of gates;
    mapping, by said computer, said second synthesized pattern of gates to a second non-synthesized cell;
    replacing, by said computer, said first instance and said second instance with said second non-synthesized cell.

7. The method of claim 6, wherein said second synthesized pattern of gates implements a multiplexer function with a number of inputs that is greater than two.

8. The method of claim 7, wherein said second synthesized pattern of gates includes cascaded AND-OR logic functions.

9. A method of altering a multiplexer implementation, comprising:
    receiving, by a computer, a netlist that describes a synthesized logic circuit design;

parsing, by said computer, said netlist to detect a first instance of a first synthesized pattern of gates that implements a first multiplexer; and, replacing, by said computer, in said netlist, said first instance with a technology implementation of said first multiplexer.

10. The method of claim 9, wherein said first synthesized pattern of gates comprises a 2:2 AND-OR gate and an inverter.

11. The method of claim 9, wherein said first synthesized pattern of gates comprises a plurality of cascaded AND-OR logic functions.

12. The method of claim 9, wherein said first multiplexer has more than two data inputs and at least two control inputs.

13. The method of claim 9, further comprising:

receiving, by said computer, a mapping that relates said first synthesized pattern of gates to said technology implementation.

14. The method of claim 9, further comprising:

parsing, by said computer, said netlist to detect a second instance of a second synthesized pattern of gates that implements a second multiplexer comprising said first multiplexer; and, replacing, by said computer, in said netlist, said second instance with a technology implementation of said second multiplexer.

15. A non-transitory computer readable medium having instructions stored thereon for altering a multiplexer implementation that, when executed by a computer, at least direct the computer to:

receive a netlist that describes a synthesized logic circuit design;

parse said netlist to detect a first instance of a first synthesized pattern of gates that implements a first multiplexer; and, replace, in said netlist, said first instance with a technology implementation of said first multiplexer.

16. The non-transitory computer readable medium of claim 15, wherein said first synthesized pattern of gates comprises a 2:2 AND-OR gate and an inverter.

17. The non-transitory computer readable medium of claim 15, wherein said first synthesized pattern of gates comprises a plurality of cascaded AND-OR logic functions.

18. The non-transitory computer readable medium of claim 15, wherein said first multiplexer has more than two data inputs and at least two control inputs.

19. The non-transitory computer readable medium of claim 15, wherein the computer is further directed to:

receive a mapping that relates said first synthesized pattern of gates to said technology implementation.

20. The non-transitory computer readable medium of claim 15, wherein the computer is further directed to:

parse said netlist to detect a second instance of a second synthesized pattern of gates that implements a second multiplexer comprising said first multiplexer; and, replace, in said netlist, said second instance with a technology implementation of said second multiplexer.

* * * * *